US006993544B2

(12) United States Patent
Wang

(10) Patent No.: US 6,993,544 B2
(45) Date of Patent: Jan. 31, 2006

(54) LIMIT-CYCLE OSCILLATION SUPPRESSION METHOD, SYSTEM, AND COMPUTER PROGRAM PRODUCT

(75) Inventor: Minsheng Wang, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 654 days.

(21) Appl. No.: 10/228,198

(22) Filed: Aug. 27, 2002

(65) Prior Publication Data

US 2004/0044711 A1    Mar. 4, 2004

(51) Int. Cl.
*G06F 17/10* (2006.01)
(52) U.S. Cl. .................................... 708/305; 708/320
(58) Field of Classification Search ............... 708/305, 708/320
See application file for complete search history.

(56) References Cited

U.S. PATENT DOCUMENTS

| 4,407,018 | A | * | 9/1983 | Kanemasa | ................ 708/490 |
| 5,191,331 | A | | 3/1993 | Karema et al. | |
| 6,112,218 | A | * | 8/2000 | Gandhi et al. | ............ 708/320 |
| 6,833,846 | B2 | * | 12/2004 | Hasser | ...................... 715/701 |

OTHER PUBLICATIONS

Carlson, A.B., *Communication Systems—An Introduction to Signals and Noise in Electrical Communication*, Third Edition, McGraw-Hill Book Company, 1986, pp. x-xiv and 1-14.

Fettweis, A. and Meerkötter, K., "Suppression of Parasitic Oscillations in Wave Digital Filters," *IEEE Transactions on Circuits and Systems*, IEEE Circuits and Systems Society, Mar. 1975, vol. CAS-22, No. 3, pp. 239-246.

Gazsi, L., "Explicit Formulas for Lattice Wave Digital Filters," *IEEE Transactions on Circuits and Systems*, IEEE Circuits and Systems Society, Jan. 1985, vol. CAS-32, No. 1, pp. 68-88.

Oppenheim, A.V. and Schafer, R.W., "Digital Signal Processing," Prentice-Hall, Inc., 1974, pp. 418-423.

Proakis, J. and Manolakis, D., "Digital Signal Processing—Principles, Algorithms, and Applications", Prentice Hall, 1996, pp. 582-587.

(Continued)

*Primary Examiner*—Chuong D. Ngo
(74) *Attorney, Agent, or Firm*—Sterne, Kessler, Goldstein & Fox P.L.L.C.

(57) ABSTRACT

Limit-cycle oscillations are caused by the compounding of quantization errors that occurs when previous digital filter outputs are used as inputs to the digital filter for the current operation. Where a signal in a digital waveform has become a constant common value applied to the input of the digital filter (indicative that the digital waveform has suspended conveyance of data), limit-cycle oscillations often appear as "random" outputs, with values different from the common value, that occur long after the signal in the digital waveform has become the constant common value. Limit-cycle oscillations are manifested as noise in the filtered digital waveform. Such noise hampers the ability of the system to extract the signal from the filtered digital waveform. The present invention identifies the occurrence of a limit-cycle oscillation as an output different from the common value. The identified limit-cycle oscillation is set equal to the common value.

30 Claims, 9 Drawing Sheets

OTHER PUBLICATIONS

Sexton, G., "Digital Signal Processing—Chapter 1—What is Digital Signal Processing," [retrieved May 31, 2002] at http://www.bolton.ac.uk/campus/elec/ami/courseware/dspint/ch1/dspint01notes.html, 11 pages.

Sexton, G., "Digital Signal Processing—Chapter 2—Operation of Digital Filters—Part 1," [retrieved May 31, 2002] at http://www/bolton/ac.uk/campus/elec/ami/courseware/dspint/ch2/dspint02notes.html, 18 pages.

"The Relationship of Dynamic Range to Data Word Size in Digital Audio Processing", Analog Devices, Inc., [retrieved May 31, 2002], at http://www.analogdevices.com/library/whitepapers/dsp/32bit_wa.html, 9 pages.

Wesen, B., "Digital IIR filters in the z-domain (a short tutorial)", [retrieved on May 31, 2002] at http://www.sparta.lu.se/~bjorn/filter.htm. 7 pages.

* cited by examiner

LIMIT-CYCLE OSCILLATION SUPPRESSION METHOD, SYSTEM, AND COMPUTER PROGRAM PRODUCT

BACKGROUND OF THE INVENTION

1. Field of the Invention

The present invention relates to recursive, or Infinite Impulse Response (IIR), digital filters. More specifically, the present invention relates to a technique to suppress limit-cycle oscillations in an IIR digital filter.

2. Background Art

As methods for fabricating integrated electronic circuits have developed into mature technologies, progress has been marked by continual efforts to expand the number of transistors that can be fabricated on a given area of substrate material. This interest in increasing electron device density has been driven by a desire to incorporate ever more sophisticated systems onto a single chip. Particularly attractive are systems that combine communications and computing functions.

However, wireless communications technologies (and much of the existing land line networks) convey data in an analog format, while high speed computing operations are more readily accomplished on data in a digital format. Therefore, systems that combine these functions depend upon the ability to convert data between analog and digital forms. Where analog and digital formats are both used on a single chip, the system is referred to as a "mixed signal" system.

An analog waveform is susceptible to interference from other analog waveforms, distortion by the system, and the introduction of noise into the waveform. These phenomena can cause the analog waveform to change in a manner that hampers the ability of the system to extract the signal from the waveform. To minimize alterations due to distortions and noise, an analog waveform typically is converted to a digital format shortly after the analog waveform is received by the system. Discrete values of the analog waveform are sampled at a standard frequency. A quantized value is assigned to represent each sampled value. A digital waveform is produced as quantized values are assigned to the discrete sampled values of the analog waveform. While the analog waveform comprises a value that changes continuously with time, the digital waveform comprises a stream of discrete quantized values.

Ideally, there is a direct relationship between the values of the analog and digital waveforms at corresponding points in time. In reality, the use of a limited number of quantized values (i.e., bits) for the digital waveform dictates that sampled values of the analog waveform often must be rounded to the nearest quantized value. The difference between the sampled value and the quantized value is referred to as "quantization error", which is an unwanted byproduct of the quantization process.

Conversion of the analog waveform to a digital format also allows the system to reconstruct the signal to compensate for changes that occurred to the analog waveform before it was received. This function is known as "digital signal processing". Digital signal processing typically involves operations that act to compare a current discrete value in the digital waveform with one or more other discrete values at previous points in the digital waveform, and to modify the current discrete value based on a result of the comparison(s). These operations are performed by "digital filters".

Digital filters use statistical algorithms to modify current discrete values as a function of previous discrete values. Underlying digital signal processing is an assumption that, by replacing the original discrete values with the modified discrete values, the filtered digital waveform will more accurately represent the signal carried by the analog waveform before it was received by the system. Thus, a digital filter receives an original discrete value $x[n]$ as an input, and produces a modified discrete value $y[n]$ as an output.

Digital filters can be categorized according to a variety of characteristics. According to one taxonomy, when all the inputs to a digital filter are original discrete values, the digital filter is referred to as a "nonrecursive" digital filter. However, often the specific function of a nonrecursive digital filter can be performed with fewer inputs and operations by using previous filter outputs (i.e., modified discrete values) as inputs to the filter for the current operation. Such a digital filter is known as a "recursive" digital filter. For example, a nonrecursive digital filter with a function as shown in Eq. (1):

$$y[n]=x[n]+\tfrac{1}{2}x[n-1]+\tfrac{1}{4}x[n-2]+\tfrac{1}{8}x[n-3]+\ldots,$$
$$\text{for } n=0, 1, 2, \qquad\qquad \text{Eq. (1)}$$

would require an infinite number of inputs and operations. In a recursive digital filter, the function of Eq. (1) can be recast as shown in Eq. (2):

$$y[n]=\tfrac{1}{2}y[n-1]+x[n], \text{ for } n=0, 1, 2, \qquad \text{Eq. (2)}$$

Although nonrecursive digital filters can be less efficient than recursive digital filters, nonrecursive digital filters are unconditionally stable. When the signal in the digital waveform becomes a constant common value at the input of a nonrecursive digital filter (indicative that the digital waveform has suspended conveyance of data), its output will eventually dissipate to the common value and remain there. In contrast, when the signal in the digital waveform becomes a constant common value at the input of a recursive digital filter, its output can have continuous or occasional outputs with values different from the applied common value for an indefinite period of time. This condition is referred to as a "limit-cycle oscillation".

Limit-cycle oscillations are caused by the compounding of quantization errors that occurs when previous digital filter outputs are used as inputs to the digital filter for the current operation. Because of the limited number of quantized values, in some instances the modified discrete values calculated by a digital filter must be rounded to the nearest quantized value. As was the case in converting the waveform from analog to digital format, the difference between the calculated modified discrete value and the rounded modified discrete value is also a quantization error. When previous filter outputs are used as inputs to the filter for the current operation, quantization errors can be compounded in a manner that can give rise to limit-cycle oscillations.

For example, if original discrete value $x[n]$ is an impulse input as shown in Eq. (3):

$$x[n]=\{15, 0, 0, 0, 0, 0, 0, \ldots\}, \text{ for } n=0, 1, 2 \qquad \text{Eq. (3)}$$

a nonrecursive digital filter with the function shown in Eq. (1) would produce modified discrete value output $y[n]$ as shown in Eq. (4):

$$y[n]=\{15, 8, 4, 2, 1, 0, 0, \ldots\}, \text{ for } n=0, 1, 2 \qquad \text{Eq. (4)}$$

In contrast, a recursive digital filter with the function shown in Eq. (2) would produce modified discrete value output $y[n]$ as shown in Eq. (5):

$$y[n]=\{15, 8, 4, 2, 1, 1, 1, \ldots\}, \text{ for } n=0, 1, 2 \qquad \text{Eq. (5)}$$

In Eq. 4, y[0] equals 15; y[1] equals 7.5, which is rounded to 8; y[2] equals 3.75, which is rounded to 4; y[3] equals 1.875, which is rounded to 2; y[4] equals 0.9375, which is rounded to 1; y[5] equals 0.46875, which is rounded to 0; y[6] equals 0.234375, which is rounded to 0; and subsequent modified discrete quantized values are also rounded to zero. Thus, in response to an impulse input, the nonrecursive digital filter has a nonzero output for a finite period of time and eventually the output dissipates to zero and remains there. For this reason, nonrecursive digital filters are also known as "Finite Impulse Response" (FIR) filters.

In contrast, in Eq. (5), y[0] equals 15; y[1] equals 7.5, which is rounded to 8; y[2] equals 4; y[3] equals 2; y[4] equals 1; y[5] equals 0.5, which is rounded to 1; y[6] equals 0.5, which is rounded to 1; and subsequent modified discrete quantized values are also rounded to one. Thus, in response to an impulse input, the recursive digital filter has a nonzero output for an infinite period of time. For this reason, recursive digital filters are also known as "Infinite Impulse Response" (IIR) filters.

This example demonstrates how quantization errors can be compounded by IIR filters in a manner that can give rise to limit-cycle oscillations. Where a digital filter has processed a more complex waveform and the signal in the digital waveform becomes a constant common value applied to the input of the digital filter, limit-cycle oscillations often appear as "random" outputs, with values different from the common value, that occur long after the signal in the digital waveform has become the constant common value. Limit-cycle oscillations are manifested as noise in the filtered digital waveform. Such noise hampers the ability of the system to extract the signal from the filtered digital waveform.

Limit-cycle oscillations have been analyzed in J. G. Proakis and D. G. Manolakis, *Digital Signal Processing, Principles, Algorithms, and Applications*, Prentice-Hall 1996, which is incorporated herein by reference. Proakis reports that, for first- and second-order IIR filters, limit-cycle oscillations are confined to the Least Significant Bit (LSB) in the digital signal. Simulations of higher order IIR filters also show that limit-cycle oscillations tend to remain within the LSB and rarely effect the Next Least Significant Bit.

One way to eliminate limit-cycle oscillations is to use a "mute output" system. The mute output system detects when the signal in the digital waveform becomes a constant common value applied to the input of the digital filter, and acts to cause the digital waveform to bypass the digital filter. When the mute output system detects that the signal in the digital waveform ceases to comprise the constant common value, the mute output system reapplies the digital waveform to the digital filter. Causing the digital waveform to bypass the digital filter precludes the compounding of quantization errors, and thus prevents limit-cycle oscillations. However, causing the digital waveform to bypass the digital filter also delays the time in which, after the digital waveform has been reapplied to the digital filter, the modified discrete values output from the digital filter again accurately represent the signal carried by the analog waveform before it was received by the system.

Another way to reduce limit-cycle oscillations is to increase the number of quantized values (i.e., bits) used for the digital waveform. Using more quantized values reduces the degree of rounding that must occur to sampled values of the analog waveform. This decreases the quantization errors associated with converting the analog waveform to a digital format, which in turn limits the magnitude of limit-cycle oscillations associated with compounding these quantization errors. However, increasing the number of bits in the digital waveform requires the use of memory registers designed to store the additional number of bits. Such registers would occupy greater areas of the substrate material and consume additional power. Furthermore, the use of additional bits may be incompatible with the format of subsequent processing operations.

Still another way to reduce limit-cycle oscillations is through the use of "lattice wave" digital filters. Lattice wave digital filters incorporate complex algorithms that act, among other purposes, to reduce limit-cycle oscillations. However, lattice wave filters are difficult to design and implement, and therefore can increase the cost and time needed to develop a system.

What is needed is a technique to suppress limit-cycle oscillations that can readily be used with all types of digital filters.

BRIEF SUMMARY OF THE INVENTION

The present invention relates to recursive, or Infinite Impulse Response (IIR), digital filters. More specifically, the present invention relates to a technique to suppress limit-cycle oscillations in an IIR digital filter.

Limit-cycle oscillations are caused by the compounding of quantization errors that occurs when previous digital filter outputs are used as inputs to the digital filter for the current operation. Where a signal in a digital waveform has become a constant common value applied to the input of the digital filter (indicative that the digital waveform has suspended conveyance of data), limit-cycle oscillations often appear as "random" outputs, with values different from the common value, that occur long after the signal in the digital waveform has become the constant common value. Limit-cycle oscillations are manifested as noise in the filtered digital waveform. Such noise hampers the ability of the system to extract the signal from the filtered digital waveform. The present invention identifies the occurrence of a limit-cycle oscillation as an output different from the common value. The identified limit-cycle oscillation is set equal to the common value.

A method to suppress a limit-cycle oscillation from a digital circuit (e.g., a digital filter) is provided. N consecutive discrete values from the stream of discrete values that all have a common value are detected. A subsequent discrete value after the N consecutive discrete values is compared to the common value. The subsequent discrete value is set equal to the common value if the subsequent discrete value does not equal the common value. The common value can be zero. N can be between three and eleven.

In an embodiment, the N consecutive discrete values can be detected by receiving a discrete value from the stream of discrete values, comparing the received discrete value to the common value, and incrementing a counter by one if the received discrete value equals the common value.

In another embodiment, the common value can be determined by comparing the counter to zero, and setting the common value equal to the received discrete value if the counter equals zero.

In yet another embodiment, suppression of a non limit-cycle oscillation can be avoided by comparing the counter to N, and setting the counter to zero if the received discrete value is not equal to the common value and the counter is less than N.

In still another embodiment, suppression of subsequent limit-cycle oscillations can be realized by setting the counter to zero after setting the subsequent discrete value equal to the common value.

In an embodiment, identification of the limit-cycle oscillation can be refined and suppression realized by setting the subsequent discrete value equal to the common value if the subsequent discrete value is between the common value and the common value plus K, wherein K is an incremental discrete value. K can be two.

Likewise, identification of the limit-cycle oscillation can be refined and suppression realized by setting the subsequent discrete value equal to the common value if the subsequent discrete value is between the common value and the common value minus K, wherein K is an incremental discrete value. K can be two.

A system to suppress a limit-cycle oscillation from a digital circuit (e.g., a digital filter) is also provided. The system comprises a detector, a first comparer, and a suppressor. The detector is configured to detect N consecutive discrete values from the stream of discrete values that all have a common value. The first comparer is coupled to the detector, and configured to compare a subsequent discrete value after the N consecutive discrete values to said common value. The suppressor is coupled to the detector, and configured to set the subsequent discrete value equal to the common value if the subsequent discrete value does not equal the common value.

In an embodiment, the detector can comprise a first memory configured to receive a discrete value from the stream of discrete values; a second comparer coupled to the first memory, and configured to compare the discrete value to the common value; and a counter coupled to the second comparer, and configured to increment by one if the discrete value equals the common value. The second comparer can be the first comparer.

In another embodiment, the detector can further comprise a third comparer coupled to the second comparer, and configured to set the counter to zero if the discrete value is not equal to the common value and the counter is less than N. The detector can further comprise a fourth comparer coupled to the counter, and configured to compare the counter to N.

In yet another embodiment, the detector can further comprise a second memory coupled to the second comparer, and configured to store the discrete value as the common value if the counter equals zero. The system can further comprise a fifth comparer coupled to the counter, and configured to compare the counter to zero.

In still another embodiment, the detector can further comprise an incrementor, a third memory, and a sixth comparer. The incrementor is coupled to the second memory, and configured to increment the common value. The third memory is coupled to the incrementor, and configured to store an output of the incrementor. The sixth comparer is coupled to the third memory, and configured to compare the subsequent discrete value to the output.

Likewise, the detector can further comprise a decrementor, a fourth memory, and a seventh comparer. The decrementor is coupled to the second memory, and configured to decrement the common value. The fourth memory is coupled to the decrementor, and configured to store an output of the decrementor. The seventh comparer is coupled to the fourth memory, and configured to compare the subsequent discrete value to the output.

In an embodiment, the suppressor can comprise an eighth comparer coupled to the first comparer, and configured to set the first memory equal to the common value if the subsequent discrete value does not equal the common value.

In another embodiment, the suppressor can further comprise a ninth comparer coupled to the first comparer, and configured to determine whether the subsequent discrete value is between the common value and the output of the incrementor; and a tenth comparer coupled to the ninth comparer, and configured to set the first memory equal to the common value if the subsequent discrete value is between the common value and the output of the incrementor.

Likewise, the suppressor can further comprise an eleventh comparer coupled to the first comparer, and configured to determine whether the subsequent discrete value is between the common value and the output of the decrementor; and a twelfth comparer coupled to the eleventh comparer, and configured to set the first memory equal to the common value if the subsequent discrete value is between the common value and the output of the decrementor.

A computer program product for suppressing a limit-cycle oscillation from a digital circuit (e.g., a digital filter) that produces a stream of discrete values is also provided. The computer program product has computer program code embodied in a computer useable medium. The computer program code means comprises a first program code means for causing the computer system to detect N consecutive discrete values from the stream of discrete value that all have a common value, a second program code means for causing the computer system to compare a subsequent discrete value after the N consecutive discrete values to the common value, and a third program code means for causing the computer system to set the subsequent discrete value equal to the common value if the subsequent discrete value does not equal the common value.

In an embodiment, the first program code means can comprise a fourth program code means for causing the computer system to receive a discrete value from the stream of discrete values, a fifth program code means for causing the computer system to compare the discrete value to the common value, and a sixth program code means for causing the computer system to increment a counter by one if the discrete value equals the common value.

In another embodiment, the first program code means can further comprise a seventh program code means for causing the computer system to compare the counter to zero, and an eighth program code means for causing the computer system to set the common value equal to the discrete value if the counter equals zero.

In yet another embodiment, the first program code means can further comprise a ninth program code means for causing the computer system to compare the counter to N, and a tenth program code means for causing the computer system to set the counter to zero if the discrete value is not equal to the common value and the counter is less than N.

In still another embodiment, the first program code means can further comprise an eleventh program code means for causing the computer system to set the counter to zero after setting the subsequent discrete value equal to the common value.

In an embodiment, the third program code means can further comprise a twelfth program code means for causing the computer system to set the subsequent discrete value equal to the common value if the subsequent discrete value is between the common value and the common value plus K, wherein K is an incremental discrete value.

Likewise, the third program code means can further comprise a thirteenth program code means for causing the computer system to set the subsequent discrete value equal to the common value if the subsequent discrete value is between the common value and the common value minus K, wherein K is an incremental discrete value.

Further embodiments, features, and advantages of the present invention, as well as the structure and operation of the various embodiments of the present invention, are described in detail below with reference to the accompanying figures.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

The preferred embodiments of the invention are described with reference to the figures where like reference numbers indicate identical or functionally similar elements. Also in the figures, the left-most digit of each reference number identifies the figure in which the reference number is first used.

DETAILED DESCRIPTION OF THE INVENTION

Table of Contents
  Overview
  Method
  System
  Computer Program Product
  Conclusion Overview The present invention relates to recursive, or Infinite Impulse Response (IIR), digital filters. More specifically, the present invention relates to a technique to suppress limit-cycle oscillations in an IIR digital filter.

Limit-cycle oscillations are caused by the compounding of quantization errors that occurs when previous digital filter outputs are used as inputs to the digital filter for the current operation. Where a signal in a digital waveform has become a constant common value applied to the input of the digital filter (indicative that the digital waveform has suspended conveyance of data), limit-cycle oscillations often appear as "random" outputs, with values different from the common value, that occur long after the signal in the digital waveform has become the constant common value. Limit-cycle oscillations are manifested as noise in the filtered digital waveform. Such noise hampers the ability of the system to extract the signal from the filtered digital waveform. The present invention identifies the occurrence of a limit-cycle oscillation as an output different from the common value. The identified limit-cycle oscillation is set equal to the common value.

High-order IIR filters are usually implemented by cascading first- or second-order filters. This can make analysis of limit-cycle oscillations difficult. When the first filter in a cascade exhibits a limit-cycle oscillation, this can be modified by filters in succeeding stages. However, if the limit-cycle oscillation occurs at a frequency near the resonant frequency of a filter in a succeeding stage, the amplitude of the limit-cycle oscillation can be enhanced. Generally, this can be avoided by including a gain stage among the initial filters in the cascade and an attenuation stage among the succeeding filters. This practice confines limit-cycle oscillations output from the cascade to the Least Significant Bit.

Figure 1A:
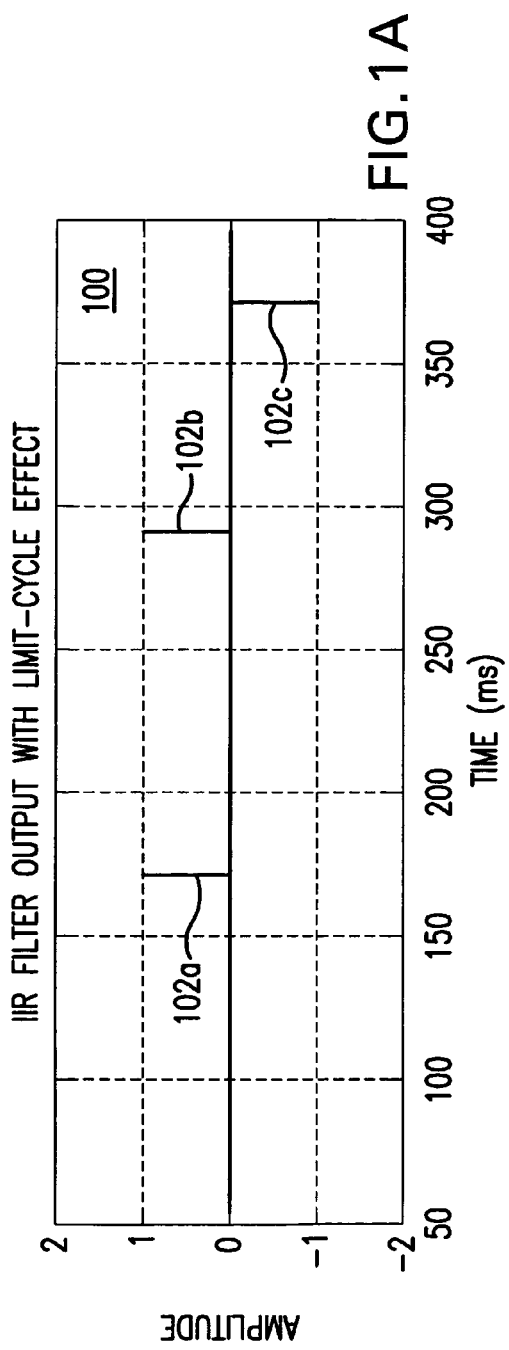
FIG. 1A is a graph 100 of amplitude versus time for the output from an eighth-order bandpass IIR filter with zero inputs.

FIG. 1A is a graph 100 of amplitude versus time for the output from an eighth-order bandpass IIR filter with zero inputs. The eighth-order bandpass IIR filter comprises a fifth-order lowpass IIR filter cascaded with a third-order highpass IIR filter. Ideally, the output from the eighth-order bandpass IIR filter with zero inputs should be zero outputs. However, graph 100 shows the presence of occasional limit-cycle oscillations 102a, 102b, and 102c having amplitudes of plus one or minus one.

Figure 1B:
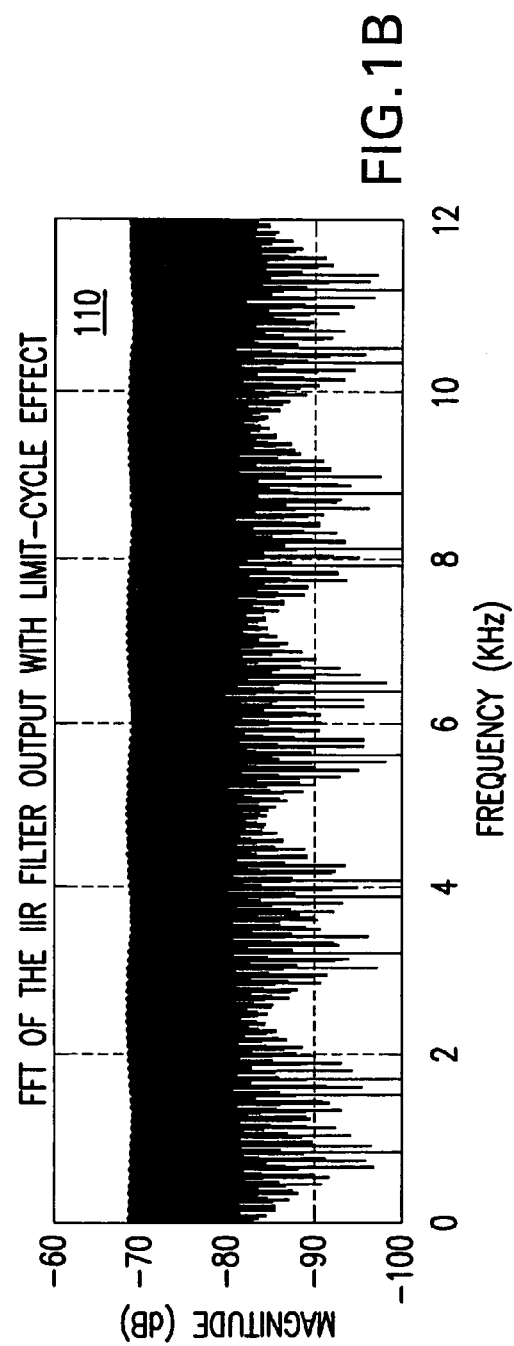
FIG. 1B is a graph 110 of magnitude (in decibels) versus frequency for the Fast Fourier Transform of the output of the eighth-order bandpass IIR filter of FIG. 1A.

FIG. 1B is a graph 110 of magnitude (in decibels) versus frequency for the Fast Fourier Transform of the output of the eighth-order bandpass IIR filter of FIG. 1A. Graph 110 shows a noise floor at −70 decibels. Such a high noise floor is unacceptable for high-performance audio systems, which require noise floors less than −115 decibels.

Figure 1C:
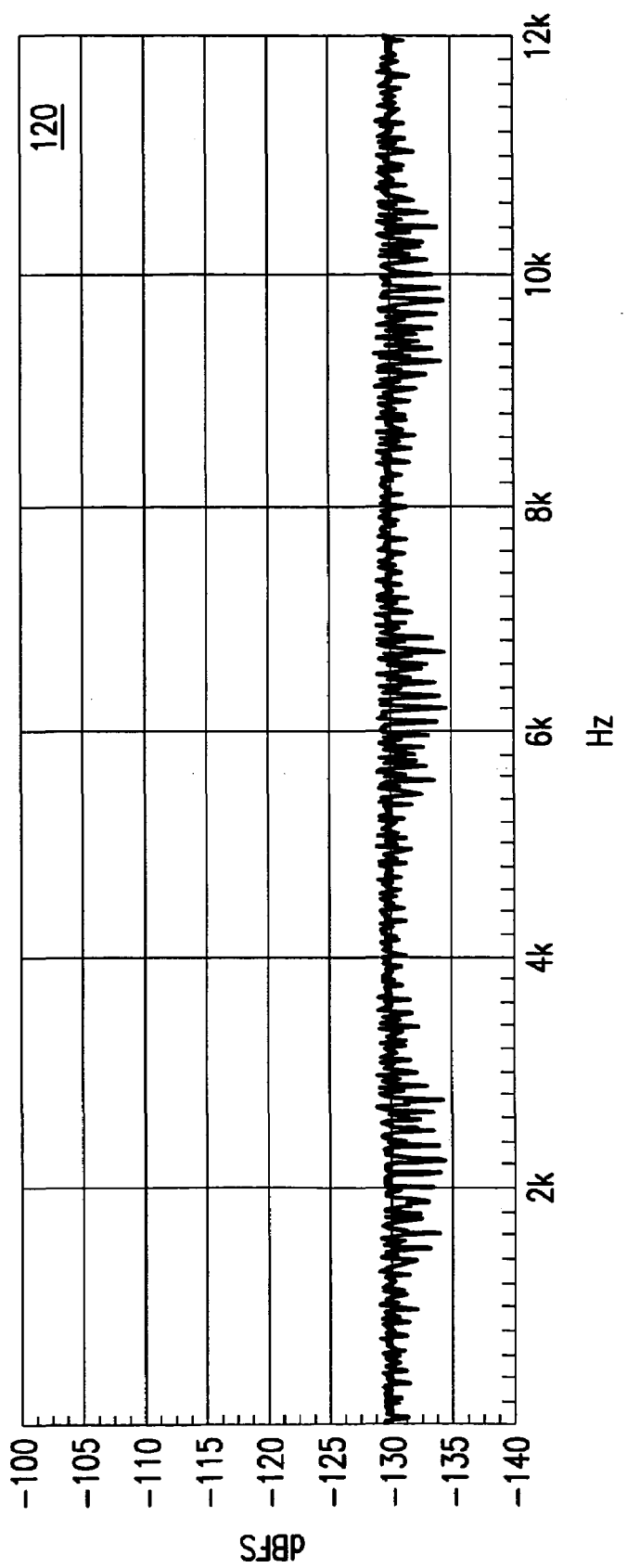
FIG. 1C is a graph 120 of magnitude (in decibels) versus frequency for the Fast Fourier Transform of the output of the eighth-order bandpass IIR filter of FIG. 1A with limit-cycle oscillations suppressed in the manner of the present invention.

FIG. 1C is a graph 120 of magnitude (in decibels) versus frequency for the Fast Fourier Transform of the output of the eighth-order bandpass IIR filter of FIG. 1A with limit-cycle oscillations suppressed in the manner of the present invention. Graph 120 shows a noise floor at −128 decibels, which is acceptable for high-performance audio systems.

Method

Because both limit-cycle oscillations and signals in digital waveforms usually comprise discrete values that are different from the common value, distinguishing between the two can sometimes be difficult. Thus, limit-cycle oscillations typically are identified using a statistical approach to determine whether a discrete value that is different from the common value is a limit-cycle oscillation.

Figure 2:
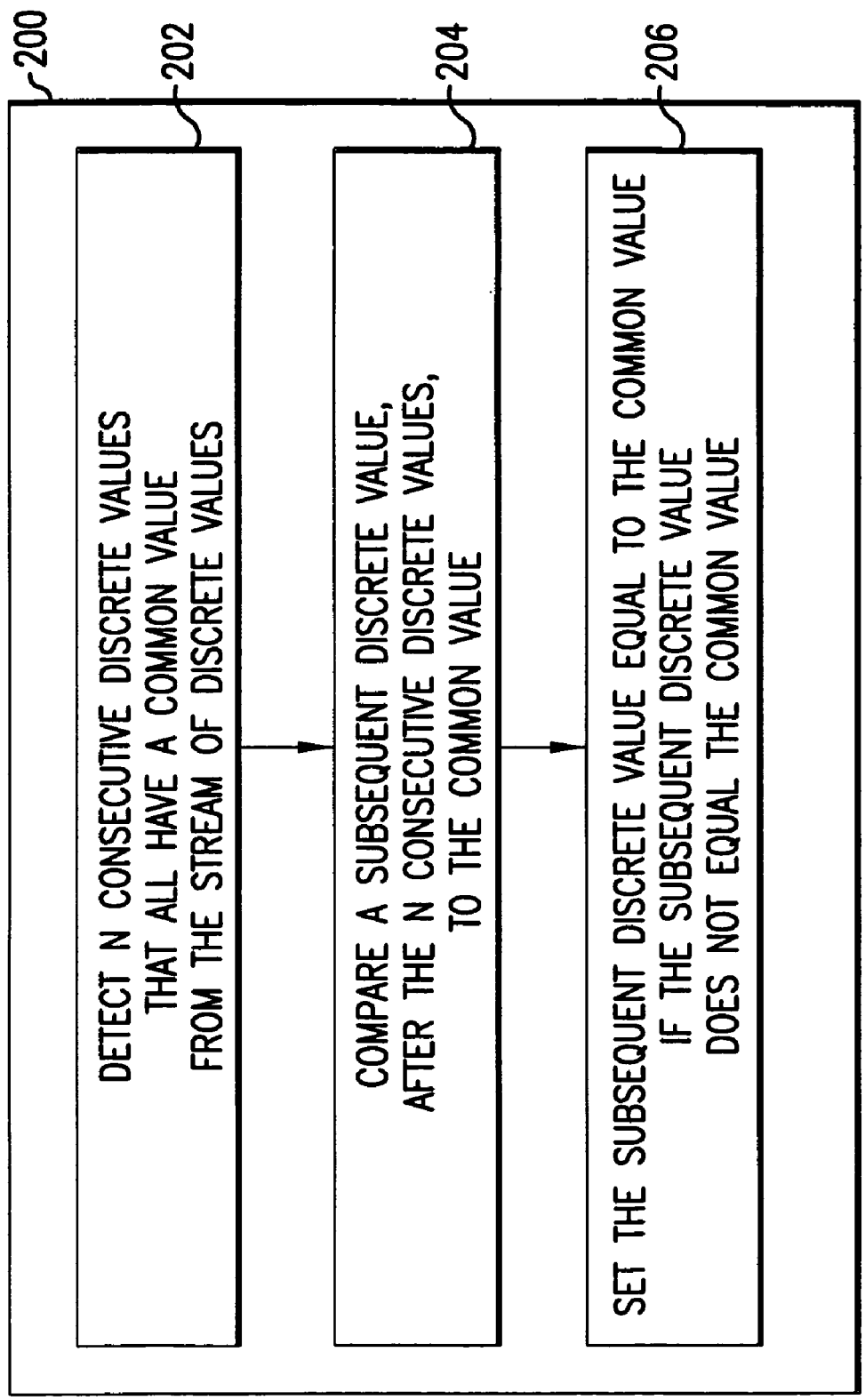
FIG. 2 shows a high level flow chart of a method 200 to suppress a limit-cycle oscillation from a digital circuit (e.g., a digital filter).

FIG. 2 shows a high level flow chart of a method 200 to suppress a limit-cycle oscillation from a digital circuit (e.g., a digital filter). In method 200, at a step 202, N consecutive discrete values that all have a common value are detected from the stream of discrete values. The common value can be zero, but is not limited to this value. Because limit-cycle oscillations often appear as "random" values that are different from the common value and occur long after the signal in the digital waveform has become the constant common value, a sequence of consecutive discrete values equal to the common value is indicative that the signal in the digital waveform has become the constant common value.

At a step 204, a subsequent discrete value, after the N consecutive discrete values, is compared to the common value. A discrete value different from the common value that occurs long after the signal in the digital waveform has become the constant common value is identified as a limit-cycle oscillation.

At a step 206, the subsequent discrete value is set equal to the common value if the subsequent discrete value is not equal to the common value. This suppresses the limit-cycle oscillation.

The choice of the value of N presents a tradeoff between suppressing limit-cycle oscillations and preserving the fidelity of a signal in a digital waveform input to a digital circuit (e.g., a digital filter). For example, after a period in which the signal in the digital waveform has become the constant common value (indicative that the digital waveform has suspended conveyance of data), it is possible that, once the signal deviates from the constant common value (indicative that the digital waveform has recommenced conveyance of data), the initial discrete value from the digital circuit can be mistaken for a limit-cycle oscillation and set equal to the constant common value. Furthermore, a signal in a digital waveform applied to a digital circuit can include a sequence of consecutive discrete values equal to the common value and followed by a discrete value not equal to the common value.

Therefore, it is possible that, by selecting too low a value of N, a discrete value not equal to the common value, but in response to the input sequence, can be mistaken for a limit-cycle oscillation, and suppressed (i.e., set equal to the common value). Alternatively, if N has too high a value, then it is possible that actual limit-cycle oscillations, that occur on a frequent basis, can be mistaken for a recommencement of conveyance of data in the digital waveform, and not suppressed. For many digital signal processing applications, a value of N between three and eleven provides sufficient suppression of limit-cycle oscillations, while minimizing the impact to the fidelity of the signal of the digital waveform input to the digital circuit.

Analysis of limit-cycle oscillations in J. G. Proakis and D. G. Manolakis, *Digital Signal Processing, Principles, Algorithms, and Applications*, Prentice-Hall 1996, which is incorporated herein by reference, shows that, for first- and second-order IIR filters, limit-cycle oscillations are confined to the Least Significant Bit, and, for higher order IIR filters, rarely effect the Next Least Significant Bit. Thus, in other embodiments of the present invention, the occurrence of a limit-cycle oscillation can be identified based on the degree to which the subsequent discrete value deviates from the common value.

Figure 2A:
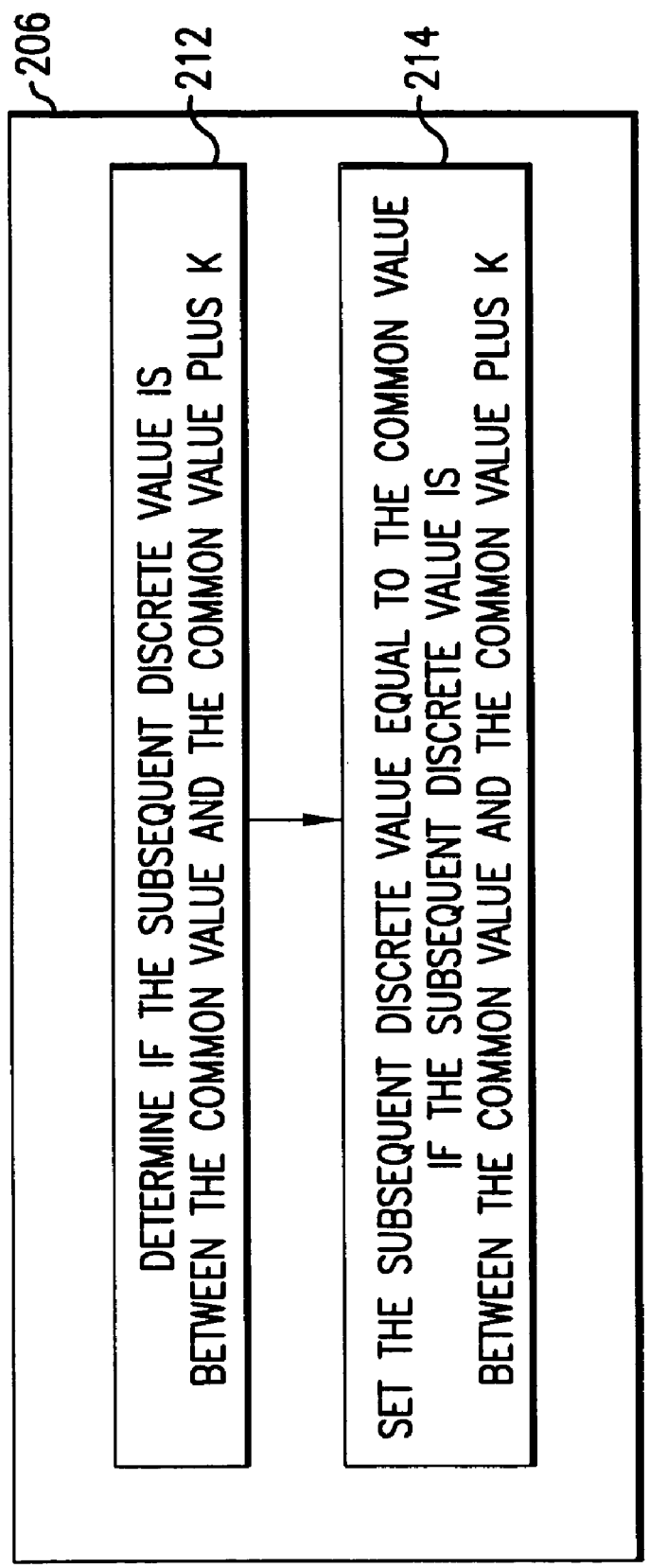
FIG. 2A shows a flow chart of a method of a first alternative to step 206.
Figure 2B:
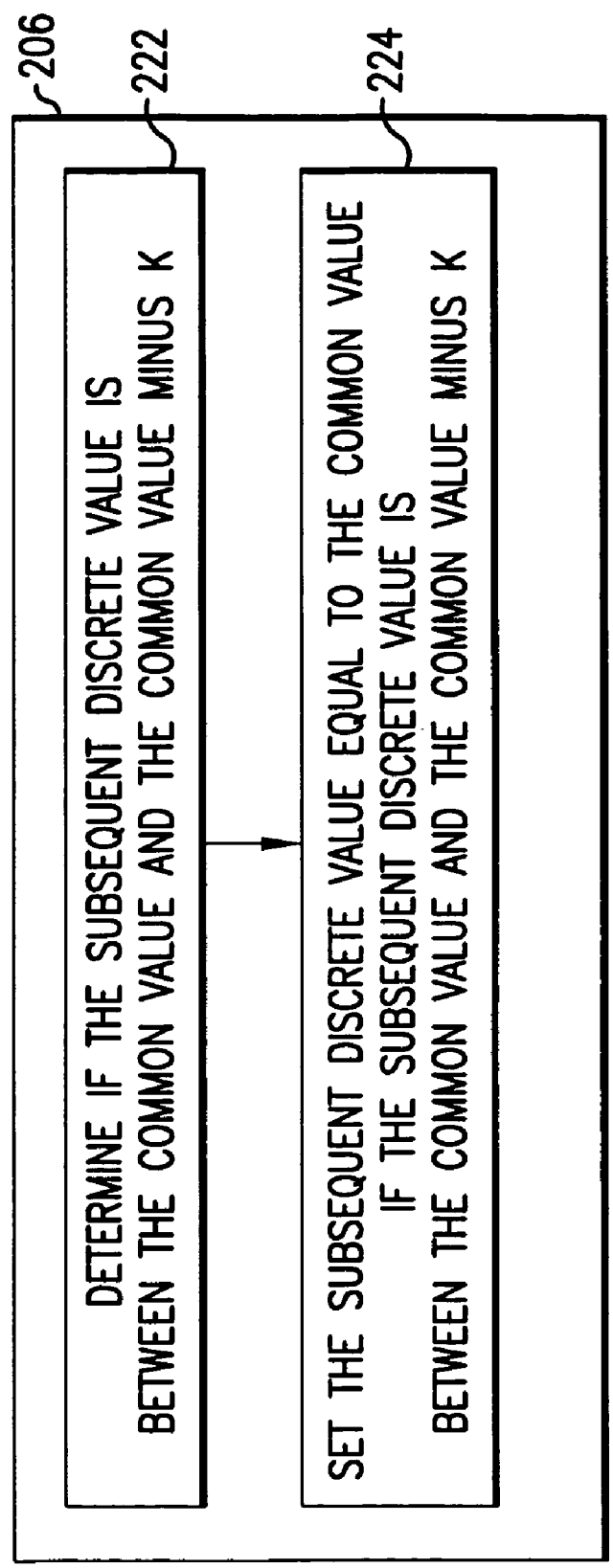
FIG. 2B shows a flow chart of a method of a second alternative to step 206.

FIG. 2A shows a flow chart of a method of a first alternative to step 206. At a step 212, it is determined if the subsequent discrete value is between the common value and the common value plus K. At a step 214, the subsequent discrete value is set equal to the common value if the subsequent discrete value is between the common value and the common value plus K. Likewise, FIG. 2B shows a flow chart of a method of a second alternative to step 206. At a step 222, it is determined if the subsequent discrete value is between the common value and the common value minus K. At a step 224, the subsequent discrete value is set equal to the common value if the subsequent discrete value is between the common value and the common value minus K. In another embodiment, step 206 can be replaced by a combination of steps 212, 214, 222, and 224.

Advantageously, identifying that the subsequent discrete value is between the common value and the common value plus K or that the next discrete value is between the common value and the common value minus K, rather than merely identifying that the subsequent discrete value does not equal the common value, reduces the likelihood that a discrete value, caused by a recommencement of conveyance of data in the digital waveform, will be mistaken for a limit-cycle oscillation. However, limiting the identification of limit-cycle oscillations to discrete values that are between the common value and the common value plus or minus K can result in some limit-cycle oscillations not being suppressed. K can be equal to two, but is not limited to this value.

Figure 3:
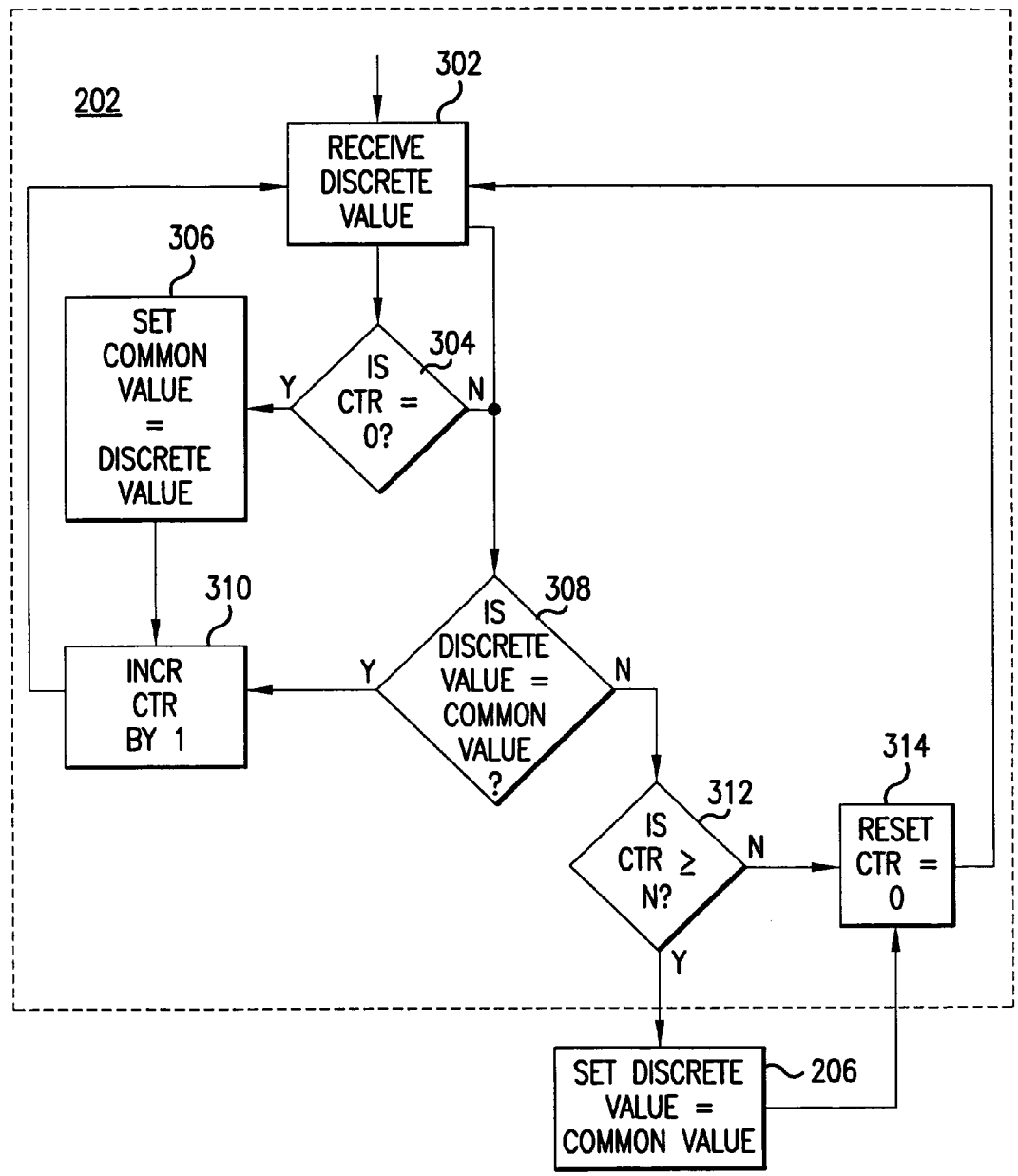
FIG. 3 shows a flow chart of a method to detect N consecutive discrete values from the stream of discrete values that all have a common value.

To further explain step 202, FIG. 3 shows a flow chart of a method to detect N consecutive discrete values from the stream of discrete values that all have a common value. One skilled in the art will recognize that there are other means by which the occurrence of a limit-cycle oscillation can be identified. Therefore, the present invention is not limited to the method shown in FIG. 3.

At a step 302, a discrete value from the digital circuit is received. After step 302, the method can proceed to an optional step 304 or a step 308.

Optional step 304 is a decision point. At step 304, the value in the counter, originally set equal to zero, is compared to zero. If the value in the counter equals zero, then the method proceeds to a step 306. If the value in the counter does not equal zero, then the method proceeds to step 308.

At step 306, the common value is set equal to the received discrete value. After step 306, the method proceeds to a step 310. At step 310, the counter is incremented by one. After step 310, the method proceeds to step 302 again to receive a discrete value from the digital circuit.

Step 308 is also a decision point. At step 308, the received discrete value is compared to the common value. If the received discrete value equals the common value, then the method proceeds to step 310. If the received discrete value does not equal the common value, then the method proceeds to an optional step 312.

Optional step 312 is also a decision point. At step 312, the value in the counter is compared to N. If the value in the counter is less than N, then the method proceeds to an optional step 314. If the value in the counter is greater than or equal to N, then the method proceeds to step 206. At optional step 314, the counter is reset to zero. After step 314, the method proceeds to step 302 again to receive a discrete value from the digital circuit.

At step 206, the received discrete value is set equal to the common value. After step 206, the method proceeds to step 314. At step 314, the counter is reset to zero. After step 314, the method proceeds to step 302 again to receive a discrete value from the digital circuit.

If method 200 uses a counter to detect N consecutive discrete value from the stream of discrete values that all have a common value, the counter can be set to zero after the subsequent discrete value is set equal to the common value at step 206.

Figure 4:
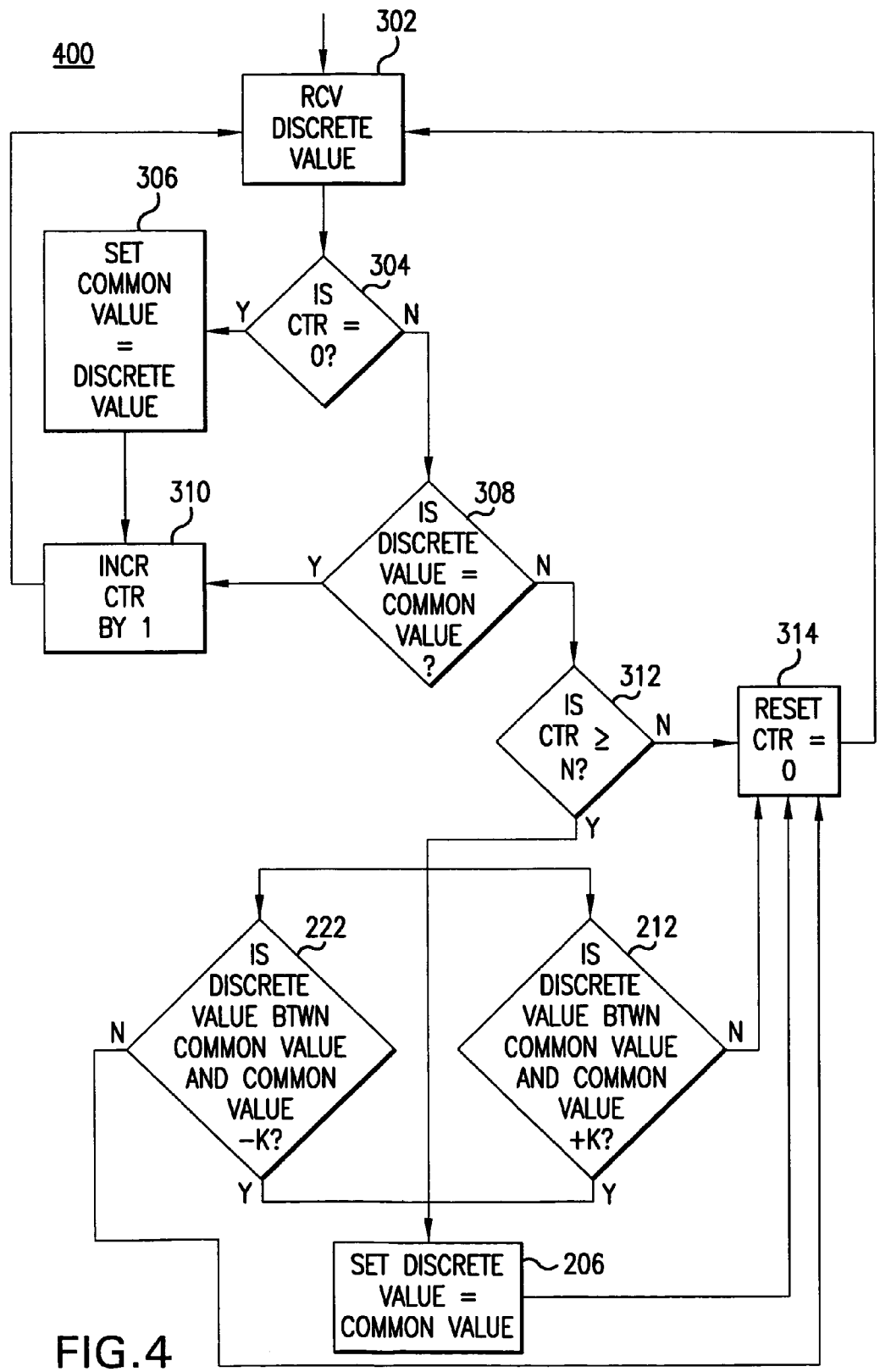
FIG. 4 shows a flow chart of a preferred method 400 to suppress a limit-cycle oscillation from a digital circuit (e.g., a digital filter).

FIG. 4 shows a flow chart of a preferred method 400 to suppress a limit-cycle oscillation from a digital circuit (e.g., a digital filter). In method 400, at step 302, a discrete value from the digital circuit is received. After step 302, method 400 proceeds to step 304. Step 304 is a decision point. At step 304, the value in the counter, originally set equal to zero, is compared to zero. If the value in the counter equals zero, then method 400 proceeds to step 306. If the value in the counter does not equal zero, then method 400 proceeds to step 308.

At step 306, the common value is set equal to the received discrete value. After step 306, method 400 proceeds to step 310. At step 310, the counter is incremented by one. After step 310, method 400 proceeds to step 302 again to receive a discrete value from the digital circuit.

Step 308 is also a decision point. At step 308, the received discrete value is compared to the common value. If the received discrete value equals the common value, then method 400 proceeds to step 310. If the received discrete value does not equal the common value, then method 400 proceeds to step 312.

Step 312 is also a decision point. At step 312, the value in the counter is compared to N. If the value in the counter is less than N, then method 400 proceeds to step 314. If the value in the counter is greater than or equal to N, then method 400 proceeds, in alternative embodiments, to one or more of step 206, step 212, or step 222. At step 314, the counter is reset to zero. After step 314, method 400 proceeds to step 302 again to receive a discrete value from the digital circuit.

At step 206, the received discrete value is set equal to the common value. After step 206, method 400 proceeds to step 314. At step 314, the counter is reset to zero. After step 314, method 400 proceeds to step 302 again to receive a discrete value from the digital circuit.

Step 212 is a decision point. At step 212, the received discrete value is compared to the common value and the common value plus K. If the received discrete value is between the common value and the common value plus K, then method 400 proceeds to step 206. If the received discrete value is not between the common value and the common value plus K, then method 400 proceeds to step 314.

Likewise, step 222 is also a decision point. At step 222, the received discrete value is compared to the common value and the common value minus K. If the received discrete value is between the common value and the common value minus K, then method 400 proceeds to step 206. If the received discrete value is not between the common value and the common value minus K, then method 400 proceeds to step 314.

Operation of method 400 of the present invention can be explained further by demonstrating how it would respond to an exemplary stream of discrete values from a digital circuit, such as exemplary discrete output y[n] as shown in Eq. (6):

$$y[n]=\{15, 2, 2, 2, 2, 2, 2, 3, 2, 2, 2, 2, 2, 0, 2, 2, 2, 2, 1, 2, 2, 2, 2, 2, -7, 15, \ldots\}$$ Eq. (6)

which corresponds to discrete input x[n] as shown in Eq. (7):

$$x[n]=\{15, 2, 2, 2, 2, 2, 2, 2, 2, 2, 2, 2, 2, 2, 2, 2, 2, 2, 2, 2, 2, 2, 2, -7, 15, \ldots\}$$ Eq. (7)

For this example, N equals five, K equals two, and the counter is originally set to zero.

First discrete value, 15, is received at step 302. At step 304, the value in the counter (i.e., zero) is compared to zero. Because zero equals zero, method 400 proceeds to step 306. At step 306, the common value is set equal to the received discrete value (i.e., 15). After step 306, method 400 proceeds to step 310. At step 310, the value in the counter (i.e., zero) is incremented by one so that the value in the counter is one. After step 310, method 400 proceeds to step 302 again to receive a discrete value from the digital circuit.

Second discrete value, 2, is received at step 302. At step 304, the value in the counter (i.e., one) is compared to zero. Because one does not equal zero, method 400 proceeds to step 308. At step 308, the received discrete value (i.e., 2) is compared to the common value (i.e., 15). Because 2 does not equal 15, method 400 proceeds to step 312. At step 312, the value in the counter (i.e., one) is compared to N (i.e., five). Because one is less than five, method 400 proceeds to step 314. At step 314, the counter is reset to zero. After step 314, method 400 proceeds to step 302 again to receive a discrete value from the digital circuit.

Third discrete value, 2, is received at step 302. At step 304, the value in the counter (i.e., zero) is compared to zero. Because zero equals zero, method 400 proceeds to step 306. At step 306, the common value is set equal to the received discrete value (i.e., 2). After step 306, method 400 proceeds to step 310. At step 310, the value in the counter (i.e., zero) is incremented by one so that the value in the counter is one. After step 310, method 400 proceeds to step 302 again to receive a discrete value from the digital circuit.

Fourth discrete value, 2, is received at step 302. At step 304, the value in the counter (i.e., one) is compared to zero. Because one does not equal zero, method 400 proceeds to step 308. At step 308, the received discrete value (i.e., 2) is compared to the common value (i.e., 2). Because 2 equals 2, method 400 proceeds to step 310. At step 310, the value in the counter (i.e., one) is incremented by one so that the value in the counter is two. After step 310, method 400 proceeds to step 302 again to receive a discrete value from the digital circuit.

Fifth, sixth, and seventh discrete values are all 2. They are received in turn at step 302, the value in the counter is compared to zero at step 304, the received discrete value (i.e., 2) is compared to the common value (i.e., 2) at step 308, and each received discrete value causes, at step 310, the value in the counter to be incremented by one so that the final value in the counter is five. After step 310, method 400 proceeds to step 302 again to receive a discrete value from the digital circuit.

Eighth discrete value, 3, is received at step 302. At step 304, the value in the counter (i.e., five) is compared to zero. Because five does not equal zero, method 400 proceeds to step 308. At step 308, the received discrete value (i.e., 3) is compared to the common value (i.e., 2). Because 3 does not equal 2, method 400 proceeds to step 312. At step 312, the value in the counter (i.e., five) is compared to N (i.e., five). Because five equals five, method 400 proceeds, in alternative embodiments, to one or more of step 206, step 212, or step 222.

In one embodiment, at step 206, the received discrete value (i.e., 3) is set equal to the common value (i.e., 2). After step 200, method 400 proceeds to step 314. At step 314, the counter is reset to zero. After step 314, method 400 proceeds to step 302 again to receive a discrete value from the digital circuit.

In another embodiment, at step 212, the received discrete value (i.e., 3) is compared to the common value (i.e., 2) and the common value plus K (i.e., 4). Because 3 is between 2 and 4, method 400 proceeds to step 206.

In yet another embodiment, at step 222, the received discrete value (i.e., 3) is compared to the common value (i.e., 2) and the common value minus K (i.e., 0). Because 3 is not between 2 and 0, method 400 proceeds to step 314.

Ninth discrete value, 2, is received at step 302. At step 304, the value in the counter (i.e., zero) is compared to zero.

Because zero equals zero, method 400 proceeds to step 306. At step 306, the common value is set equal to the received discrete value (i.e., 2). After step 306, method 400 proceeds to step 310. At step 310, the value in the counter (i.e., zero) is incremented by one so that the value in the counter is one. After step 310, method 400 proceeds to step 302 again to receive a discrete value from the digital circuit.

Tenth, eleventh, twelfth, and thirteenth discrete values are all 2. They are received in turn at step 302, the value in the counter is compared to zero at step 304, the received discrete value (i.e., 2) is compared to the common value (i.e., 2) at step 308, and each received discrete value causes, at step 310, the value in the counter to be incremented by one so that the final value in the counter is five. After step 310, method 400 proceeds to step 310 again to receive a discrete value from the digital circuit.

Fourteenth discrete value, 0, is received at step 302. At step 304, the value in the counter (i.e., five) is compared to zero. Because five does not equal zero, method 400 proceeds to step 308. At step 308, the received discrete value (i.e., 0) is compared to the common value (i.e., 2). Because 0 does not equal 2, method 400 proceeds to step 312. At step 312, the value in the counter (i.e., five) is compared to N (i.e., five). Because five equals five, method 400 proceeds, in alternative embodiments, to one or more of step 206, step 212, or step 222.

In one embodiment, at step 206, the received discrete value (i.e., 0) is set equal to the common value (i.e., 2). After step 206, method 400 proceeds to step 314. At step 314, the counter is reset to zero. After step 314, method 400 proceeds to step 302 again to receive a discrete value from the digital circuit.

In another embodiment, at step 212, the received discrete value (i.e., 0) is compared to the common value (i.e., 2) and the common value plus K (i.e., 4). Because 0 is not between 2 and 4, method 400 proceeds to step 314.

In yet another embodiment, at step 222, the received discrete value (i.e., 0) is compared to the common value (i.e., 2) and the common value minus K (i.e., 0). Because 0 is not between 2 and 0, method 400 proceeds to step 314.

Fifteenth discrete value, 2, is received at step 302. At step 304, the value in the counter (i.e., zero) is compared to zero. Because zero equals zero, method 400 proceeds to step 306. At step 306, the common value is set equal to the received discrete value (i.e., 2). After step 306, method 400 proceeds to step 310. At step 310, the value in the counter (i.e., zero) is incremented by one so that the value in the counter is one. After step 310, method 400 proceeds to step 302 again to receive a discrete value from the digital circuit.

Sixteenth, seventeenth, and eighteenth discrete values are all 2. They are received in turn at step 302, the value in the counter is compared to zero at step 304, the received discrete value (i.e., 2) is compared to the common value (i.e., 2) at step 308, and each received discrete value causes, at step 310, the value in the counter to be incremented by one so that the final value in the counter is four. After step 310, method 400 proceeds to step 310 again to receive a discrete value from the digital circuit.

Nineteenth discrete value, 1, is received at step 302. At step 304, the value in the counter (i.e., four) is compared to zero. Because four does not equal zero, method 400 proceeds to step 308. At step 308, the received discrete value (i.e., 1) is compared to the common value (i.e., 2). Because 1 does not equal 2, method 400 proceeds to step 312. At step 312, the value in the counter (i.e., four) is compared to N (i.e., five). Because four is less than five, method 400 proceeds to step 314. At step 314, the counter is reset to zero. After step 314, method 400 proceeds to step 302 again to receive a discrete value from the digital circuit.

Twentieth discrete value, 2, is received at step 302. At step 304, the value in the counter (i.e., zero) is compared to zero. Because zero equals zero, method 400 proceeds to step 306. At step 306, the common value is set equal to the received discrete value (i.e., 2). After step 306, method 400 proceeds to step 310. At step 310, the value in the counter (i.e., zero) is incremented by one so that the value in the counter is one. After step 310, method 400 proceeds to step 302 again to receive a discrete value from the digital circuit.

Twenty-first, twenty-second, twenty-third, and twenty-fourth discrete values are all 2. They are received in turn at step 302, the value in the counter is compared to zero at step 304, the received discrete value (i.e., 2) is compared to the common value (i.e., 2) at step 308, and each received discrete level causes, at step 310, the value in the counter to be incremented by one so that the final value in the counter is five. After step 310, method 400 proceeds to step 310 again to receive a discrete value from the digital circuit.

Twenty-fifth discrete value, −7, is received at step 302. At step 304, the value in the counter (i.e., five) is compared to zero. Because five does not equal zero, method 400 proceeds to step 308. At step 308, the received discrete value (i.e., −7) is compared to the common value (i.e., 2). Because −7 does not equal 2, method 400 proceeds to step 312. At step 312, the value in the counter (i.e., five) is compared to N (i.e., five). Because five equals five, method 400 proceeds, in alternative embodiments, to one or more of step 206, step 212, or step 222.

In one embodiment, at step 206, the received discrete value (i.e., −7) is set equal to the common value (i.e., 2). After step 206, method 400 proceeds to step 314. At step 314, the counter is reset to zero. After step 314, method 400 proceeds to step 302 again to receive a discrete value from the digital circuit.

In another embodiment, at step 212, the received discrete value (i.e., −7) is compared to the common value (i.e., 2) and the common value plus K (i.e., 4). Because −7 is not between 2 and 4, method 400 proceeds to step 314.

In yet another embodiment, at step 222, the received discrete value (i.e., −7) is compared to the common value (i.e., 2) and the common value minus K (i.e., 0). Because −7 is not between 2 and 0, method 400 proceeds to step 314.

Twenty-sixth discrete value, 15, is received at step 302. At step 304, the value in the counter (i.e., zero) is compared to zero. Because zero equals zero, method 400 proceeds to step 306. At step 306, the common value is set equal to the received discrete value (i.e., 15). After step 306, method 400 proceeds to step 310. At step 310, the value in the counter (i.e., zero) is incremented by one so that the value in the counter is one. After step 310, method 400 proceeds to step 302 again to receive a discrete value from the digital circuit.

The above example demonstrates the limitations and tradeoffs of the alternative embodiments of the present invention. In the first embodiment (i.e., step 312 to step 206), output $z_1[n]$ is as shown in Eq. (7):

$$z_1[n] = \{15, 2, 2, 2, 2, 2, 2, 2, 2, 2, 2, 2, 2, 2, 2, 2, 2, 1, 2, 2, 2, 2, 2, 15, \ldots\} \quad \text{Eq. (7)}$$

In the second embodiment (i.e., step 312 to step 212), output $z_2[n]$ is as shown in Eq. (8):

$$z_2[n] = \{15, 2, 2, 2, 2, 2, 2, 2, 2, 2, 2, 2, 2, 0, 2, 2, 2, 2, 1, 2, 2, 2, 2, 2, -7, 15, \ldots\} \quad \text{Eq. (8)}$$

In the third embodiment (i.e., step 312 to step 222), output $z_3[n]$ is as shown in Eq. (9):

$$z_3[n]=\{15, 2, 2, 2, 2, 2, 2, 3, 2, 2, 2, 2, 2, 0, 2, 2, 2, 2,$$
$$1, 2, 2, 2, 2, 2, -7, 15, \ldots\} \qquad \text{Eq. (9)}$$

As was mentioned above, embodiments can combine one or more of step 206, step 212, or step 222. For example, a fourth embodiment could combine the second and third embodiments (i.e., step 312 to step 212 and step 312 to step 222). In the fourth embodiment, output $z_4[n]$ is as shown in Eq. (10):

$$z_4[n]=\{15, 2, 2, 2, 2, 2, 2, 2, 2, 2, 2, 2, 2, 0, 2, 2, 2, 2,$$
$$1, 2, 2, 2, 2, 2, -7, 15, \ldots\} \qquad \text{Eq. (10)}$$

In the first embodiment, limit-cycle oscillations are identified simply when a discrete value does not equal the common value. In contrast, in the fourth embodiment, limit-cycle oscillations are more strictly identified when a discrete value does not equal the common value plus or minus one. A comparison of the first and fourth embodiments highlights some of the limitations and tradeoffs of the alternative embodiments of the present invention.

In both embodiments, eighth discrete value, 3, is treated as a limit-cycle oscillation, and is suppressed. In both embodiments, eighth discrete value, 3, would not have been suppressed if the value of N was greater than five. Additionally, in both embodiments, nineteenth discrete value, 1, is treated as a deviation from the constant common value that is indicative that the digital waveform has recommenced conveyance of data, and is not suppressed. In both embodiments, nineteenth discrete value, 1, would have been suppressed if the value of N was less than five.

Furthermore, in the first embodiment, fourteenth discrete value, 0, is treated as a limit-cycle oscillation, and is suppressed. In the fourth embodiment, fourteenth discrete value, 0, is treated as a deviation from the constant common value that is indicative that the digital waveform has recommenced conveyance of data, and is not suppressed. Additionally, in the first embodiment, twenty-fifth discrete value, −7, is treated as a limit-cycle oscillation, and is suppressed. In the fourth embodiment, twenty-fifth discrete value, −7, is treated as a deviation from the constant common value that is indicative that the digital waveform has recommenced conveyance of data, and is not suppressed.

One skilled in the art will recognize that the above described method can be implemented using hardware, software, firmware, or a combination thereof.

System

Figure 5:
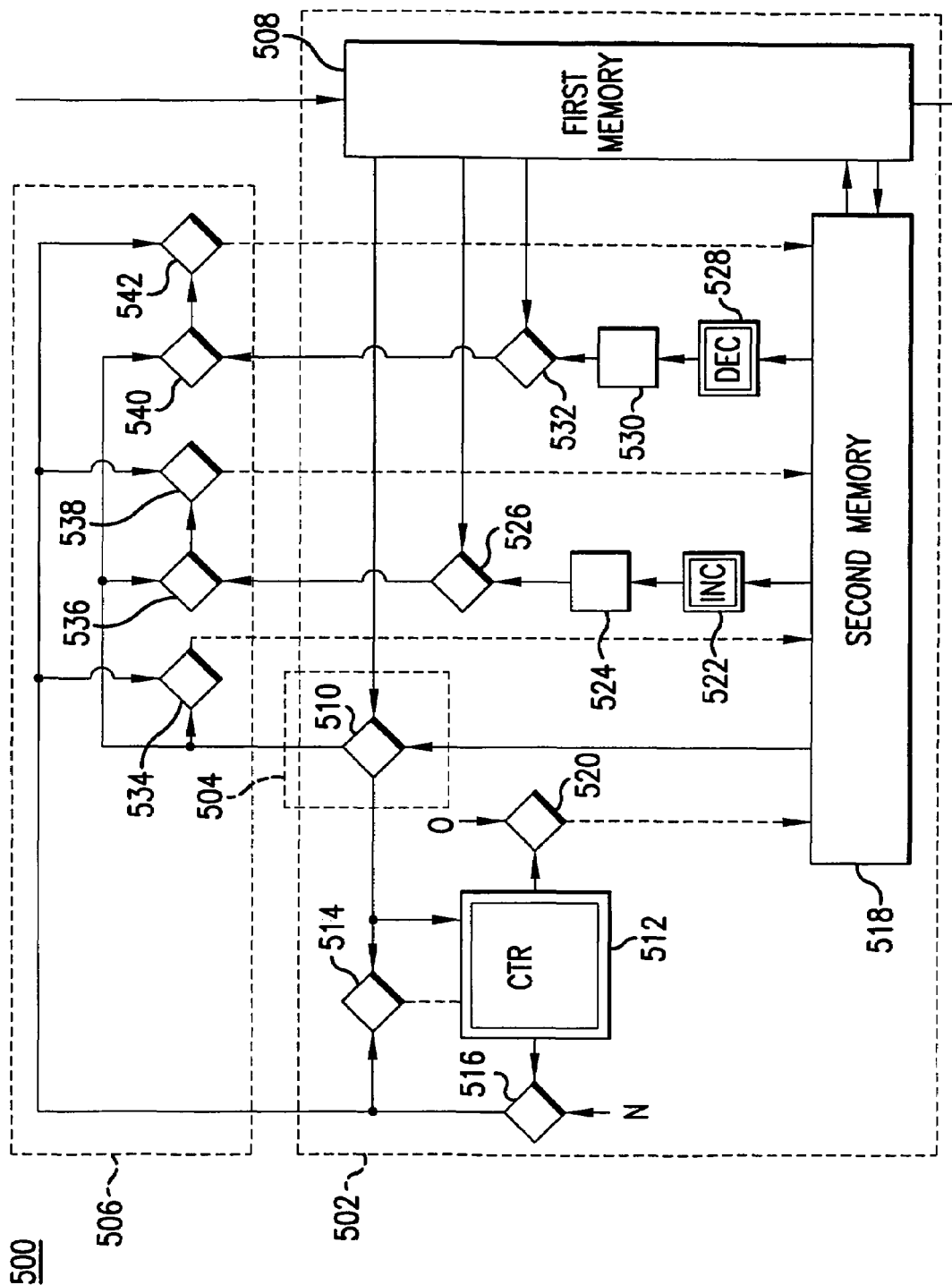
FIG. 5 shows a block diagram of a system 500 to suppress a limit-cycle oscillation from a digital circuit (e.g., a digital filter).

FIG. 5 shows a block diagram of a system 500 to suppress a limit-cycle oscillation from a digital circuit (e.g., a digital filter). System 500 comprises a detector 502, a first comparer 504, and a suppressor 506. Detector 502 is configured to detect N consecutive discrete values, from the stream of discrete values, that all have a common value. First comparer 504 is coupled to detector 502. First comparer 504 is configured to compare a subsequent discrete value, after the N consecutive discrete values, to the common value. Suppressor 506 is coupled to detector 502. Suppressor 506 is configured to set the subsequent discrete value equal to the common value if the subsequent discrete value does not equal the common value.

In an embodiment, detector 502 comprises a first memory 508, a second comparer 510, and a counter 512. First memory 508 is configured to receive a discrete value from the stream of discrete values. Second comparer 510 is coupled to first memory 508. (Second comparer 510 can be first comparer 504.) Second comparer 510 is configured to compare the discrete value to the common value. Counter 512 is coupled to second comparer. Counter 512 is configured to increment by one if the discrete value equals the common value.

Detector 502 can further comprise a third comparer 514 coupled to second comparer 510. Third comparer 514 is configured to set counter 512 to zero if the discrete value is not equal to the common value and counter 512 is less than N. Detector 502 can also further comprise a fourth comparer 516 coupled to counter 512. Fourth comparer 516 is configured to compare counter 512 to N.

Detector 502 can further comprise a second memory 518 coupled to second comparer 510. Second memory 518 is configured to store the discrete value as the common value if counter 512 equals zero. Detector 502 can also further comprise a fifth comparer 520 coupled to counter 512. Fifth comparer 520 is configured to compare counter 512 to zero. If counter 512 equals zero, fifth comparer 520 can act to cause the received discrete value in first memory 508 to be copied into second memory 518.

Detector 502 can further comprise an incrementor 522, a third memory 526, and a sixth comparer 528. Incrementor 524 is coupled to secondary memory 518. Incrementor 522 is configured to increment the common value. Third memory 524 is coupled to incrementor 522. Third memory 524 is configured to store an output of incrementor 522. Sixth comparer 526 is coupled to third memory 524. Sixth comparer 526 is configured to compare the subsequent discrete value to the output of incrementor 522.

Detector 502 can further comprise a decrementor 528, a fourth memory 530, and a seventh comparer 532. Decrementor 528 is coupled to secondary memory 518. Decrementor 528 is configured to decrement the common value. Fourth memory 530 is coupled to decrementor 528. Fourth memory 530 is configured to store an output of decrementor 528. Seventh comparer 532 is coupled to fourth memory 530. Seventh comparer 532 is configured to compare the subsequent discrete value to the output of decrementor 528.

In an embodiment, suppressor 506 comprises an eighth comparer 534 coupled to first comparer 504. Eighth comparer 534 is configured to set first memory 508 equal to the common value if the subsequent discrete value does not equal the common value. Eighth comparer 534 can cause the common value in second memory 518 to be copied into first memory 508.

Suppressor 506 can further comprise a ninth comparer 536 and a tenth comparer 538. Ninth comparer 536 is coupled to sixth comparer 526. Ninth comparer 536 is configured to determine whether the subsequent discrete value is between the common value and the output of incrementor 522. Tenth comparer 538 is coupled to ninth comparer 536. Tenth comparer 538 is configured to set first memory 508 equal to the common value if the subsequent discrete value is between the common value and the output of incrementor 522. Tenth comparer 538 can cause the common value in second memory 518 to be copied into first memory 508.

Suppressor 506 can further comprise an eleventh comparer 540 and a twelfth comparer 542. Eleventh comparer 540 is coupled to seventh comparer 532. Eleventh comparer 540 is configured to determine whether the subsequent discrete value is between the common value and the output of decrementor 528. Twelfth comparer 542 is coupled to eleventh comparer 540. Twelfth comparer 542 is configured to set first memory 508 equal to the common value if the subsequent discrete value is between the common value and the output of decrementor 528. Twelfth comparer 542 can cause the common value in second memory 518 to be copied into first memory 508.

One skilled in the art will recognize that the above described system can be implemented using hardware, software, firmware, or a combination thereof.

Computer Program Product

The present invention can be implemented as a computer program product for suppressing a limit-cycle oscillation from a digital circuit (e.g., a digital filter) that produces a stream of discrete values. The computer program product can have computer program code embodied in a computer useable medium. The computer program code means can comprise a first program code means for causing the computer system to detect N consecutive discrete values from the stream of discrete value that all have a common value, a second program code means for causing the computer system to compare a subsequent discrete value after the N consecutive discrete values to the common value, and a third program code means for causing the computer system to set the subsequent discrete value equal to the common value if the subsequent discrete value does not equal the common value.

In an embodiment, the first program code means can comprise a fourth program code means for causing the computer system to receive a discrete value from the stream of discrete values, a fifth program code means for causing the computer system to compare the discrete value to the common value, and a sixth program code means for causing the computer system to increment a counter by one if the discrete value equals the common value.

In an embodiment, the first program code means can further comprise a seventh program code means for causing the computer system to compare the counter to zero, and an eighth program code means for causing the computer system to set the common value equal to the discrete value if the counter equals zero.

In an embodiment, the first program code means can further comprise a ninth program code means for causing the computer system to compare the counter to N, and a tenth program code means for causing the computer system to set the counter to zero if the discrete value is not equal to the common value and the counter is less than N.

In an embodiment, the first program code means can further comprise a eleventh program code means for causing the computer system to set the counter to zero after setting the subsequent discrete value equal to the common value.

In an embodiment, the third program code means can comprise a twelfth program code means for causing the computer system to set the subsequent discrete value equal to the common value if the subsequent discrete value is between the common value and the common value plus K, wherein K is an incremental discrete value.

In an embodiment, the third program code means can comprise a thirteenth program code means for causing the computer system to set the subsequent discrete value equal to the common value if the subsequent discrete value is between the common value and the common value minus K, wherein K is an incremental discrete value.

Figure 6:
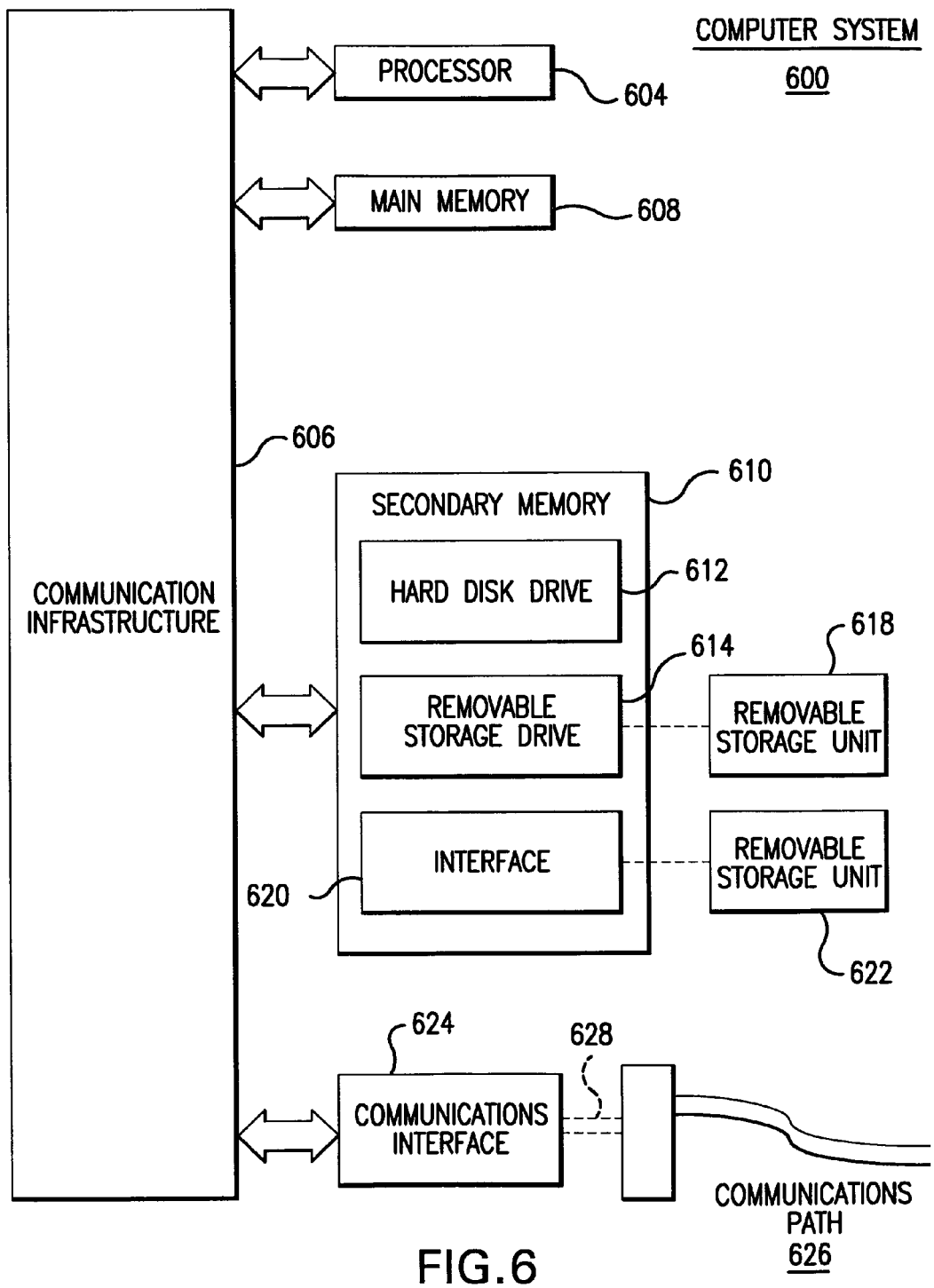
FIG. 6 illustrates an example computer system 600, in which the present invention can be implemented as programable code.

The program code means, or software, of the present invention executes on a computer system. FIG. 6 illustrates an example computer system 600, in which the present invention can be implemented as programable code. Various embodiments of the invention are described in terms of this example computer system 600. After reading this description, it will become apparent to a person skilled in the art how to implement the invention using other computer systems and/or computer architectures.

The computer system 600 includes one or more processors, such as processor 604. Processor 604 can be a special purpose or a general purpose digital signal processor. The processor 604 is connected to a communication infrastructure 606 (for example, a bus or network). Various software implementations are described in terms of this exemplary computer system. After reading this description, it will become apparent to a person skilled in the art how to implement the invention using other computer systems and/or computer architectures.

Computer system 600 also includes a main memory 608, preferably random access memory (RAM), and may also include a secondary memory 610. The secondary memory 610 may include, for example, a hard disk drive 612 and/or a removable storage drive 614, representing a floppy disk drive, a magnetic tape drive, an optical disk drive, etc. The removable storage drive 614 reads from and/or writes to a removable storage unit 618 in a well known manner. Removable storage unit 618, represents a floppy disk, magnetic tape, optical disk, etc. which is read by and written to by removable storage drive 614. As will be appreciated, the removable storage unit 618 includes a computer usable storage medium having stored therein computer software and/or data.

In alternative implementations, secondary memory 610 may include other similar means for allowing computer programs or other instructions to be loaded into computer system 600. Such means may include, for example, a removable storage unit 622 and an interface 620. Examples of such means may include a program cartridge and cartridge interface (such as that found in video game devices), a removable memory chip (such as an EPROM, or PROM) and associated socket, and other removable storage units 622 and interfaces 620 which allow software and data to be transferred from the removable storage unit 622 to computer system 600.

Computer system 600 may also include a communications interface 624. Communications interface 624 allows software and data to be transferred between computer system 600 and external devices. Examples of communications interface 624 may include a modem, a network interface (such as an Ethernet card), a communications port, a Personal Computer Memory Card International Association (PCMCIA) slot and card, etc. Software and data transferred via communications interface 624 are in the form of signals 628 which may be electronic, electromagnetic, optical, or other signals capable of being received by communications interface 624. These signals 628 are provided to communications interface 624 via a communications path 626. Communications path 626 carries signals 628 and may be implemented using wire or cable, fiber optics, a phone line, a cellular phone link, a radio frequency link, and other communications channels.

In this document, the terms "computer program medium" and "computer usable medium" are used generally to refer to media such as removable storage drive 614, a hard disk installed in hard disk drive 612, and signals 628. These computer program products are means for providing software to computer system 600.

Computer programs (also called computer control logic) are stored in main memory 608 and/or secondary memory 610. Computer programs may also be received via communications interface 624. Such computer programs, when executed, enable the computer system 600 to implement the present invention as discussed herein. Accordingly, such computer programs represent controllers of the computer system 600. Where the invention is implemented using software, the software may be stored in a computer program product and loaded into computer system 600 using removable storage drive 614, hard drive 612, or communications interface 624.

Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A method to suppress a limit cycle oscillation from a digital circuit that produces a stream of discrete values, comprising the steps of:
   (1) detecting N consecutive discrete values from the stream of discrete values that all have a common value;
   (2) comparing a subsequent discrete value after the N consecutive discrete values to the common value; and
   (3) setting the subsequent discrete value equal to the common value if the subsequent discrete value does not equal the common value.

2. The method of claim 1, wherein the common value is zero.

3. The method of claim 1, wherein N is between three and eleven.

4. The method of claim 1, wherein said detecting step comprises the steps of:
   (i) receiving a discrete value from the stream of discrete values;
   (ii) comparing said received discrete value to the common value; and
   (iii) incrementing a counter by one if said received discrete value equals the common value.

5. The method of claim 4, further comprising the steps of:
   (iv) comparing the counter to zero; and
   (v) setting the common value equal to said received discrete value if the counter equals zero.

6. The method of claim 4, further comprising the steps of:
   (iv) comparing the counter to N; and
   (v) setting the counter to zero if said received discrete value is not equal to the common value and the counter is less than N.

7. The method of claim 4, further comprising the step of:
   setting the counter to zero after setting the subsequent discrete value equal to the common value.

8. The method of claim 1, wherein said setting step comprises the step of:
   setting the subsequent discrete value equal to the common value if the subsequent discrete value is between the common value and the common value plus K, wherein K is an incremental discrete value.

9. The method of claim 8, wherein K is two.

10. The method of claim 1, wherein said setting step comprises the step of:
    setting the subsequent discrete value equal to the common value if the subsequent discrete value is between the common value and the common value minus K, wherein K is an incremental discrete value.

11. The method of claim 10, wherein K is two.

12. A system to suppress a limit-cycle oscillation from a digital circuit that produces a stream of discrete values, comprising:
    a detector configured to detect N consecutive discrete values from the stream of discrete values that all have a common value;
    a first comparer coupled to said detector, and configured to compare a subsequent discrete value after said N consecutive discrete values to said common value; and
    a suppressor coupled to said detector, and configured to set said subsequent discrete value equal to said common value if said subsequent discrete value does not equal said common value.

13. The system of claim 12, wherein said detector comprises:
    a first memory configured to receive a discrete value from the stream of discrete values;
    a second comparer coupled to said first memory, and configured to compare said discrete value to said common value; and
    a counter coupled to said second comparer, and configured to increment by one if said discrete value equals said common value.

14. The system of claim 13, wherein said second comparer is said first comparer.

15. The system of claim 13, wherein said suppressor comprises:
    a third comparer coupled to said first comparer, and configured to set said first memory equal to said common value if said subsequent discrete value does not equal said common value.

16. The system of claim 13, wherein said detector further comprises:
    a third comparer coupled to said second comparer, and configured to set said counter to zero if said discrete value is not equal to said common value and said counter is less than N.

17. The system of claim 16, wherein said detector further comprises:
    a fourth comparer coupled to said counter, and configured to compare said counter to N.

18. The system of claim 13, wherein said detector further comprises:
    a second memory coupled to said second comparer, and configured to store said discrete value as said common value if said counter equals zero.

19. The system of claim 18, wherein said detector further comprises:
    a third comparer coupled to said counter, and configured to compare said counter to zero.

20. The system of claim 18, wherein said detector further comprises:
    an incrementor coupled to said second memory, and configured to increment said common value;
    a third memory coupled to said incrementor, and configured to store an output of said incrementor; and
    a third comparer coupled to said third memory, and configured to compare said subsequent discrete value to said output.

21. The system of claim 20, wherein said suppressor further comprises:
    a fourth comparer coupled to said third comparer, and configured to determine whether said subsequent discrete value is between said common value and said output; and
    a fifth comparer coupled to said fourth comparer, and configured to set said first memory equal to said common value if said subsequent discrete value is between said common value and said output.

22. The system of claim 18, wherein said detector further comprises:
   a decrementor coupled to said second memory, and configured to decrement said common value;
   a third memory coupled to said decrementor, and configured to store an output of said decrementor; and
   a third comparer coupled to said third memory, and configured to compare said subsequent discrete value to said output.

23. The system of claim 22, wherein said suppressor further comprises:
   a fourth comparer coupled to said third comparer, and configured to determine whether said subsequent discrete value is between said common value and said output; and
   a fifth comparer coupled to said fourth comparer, and configured to set said first memory equal to said common value if said subsequent discrete value is between said common value and said output.

24. A computer program product for suppressing a limit-cycle oscillation from a digital circuit that produces a stream of discrete values, said computer program product having computer program code embodied in a computer readable storage medium, said computer program code comprising:
   a first program code means for causing said computer system to detect N consecutive discrete values from the stream of discrete value that all have a common value;
   a second program code means for causing said computer system to compare a subsequent discrete value after the N consecutive discrete values to the common value; and
   a third program code means for causing said computer system to set the subsequent discrete value equal to the common value if the subsequent discrete value does not equal the common value.

25. The computer program product of claim 24, wherein said first program code means comprises:
   a fourth program code means for causing said computer system to receive a discrete value from the stream of discrete values;
   a fifth program code means for causing said computer system to compare the discrete value to the common value; and
   a sixth program code means for causing said computer system to increment a counter by one if the discrete value equals the common value.

26. The computer program product of claim 25, wherein said first program code means further comprises:
   a seventh program code means for causing said computer system to compare the counter to zero; and
   an eighth program code means for causing said computer system to set the common value equal to the discrete value if the counter equals zero.

27. The computer program product of claim 25, wherein said first program code means further comprises:
   a seventh program code means for causing said computer system to compare the counter to N; and
   an eighth program code means for causing said computer system to set the counter to zero if the discrete value is not equal to the common value and the counter is less than N.

28. The computer program product of claim 25, wherein said first program code means further comprises:
   a seventh program code means for causing said computer system to set the counter to zero after setting the subsequent discrete value equal to the common value.

29. The computer program product of claim 24, wherein said third program code means further comprises:
   a fourth program code means for causing said computer system to set the subsequent discrete value equal to the common value if the subsequent discrete value is between the common value and the common value plus K, wherein K is an incremental discrete value.

30. The computer program product of claim 24, wherein said third program code means further comprises:
   a fourth program code means for causing said computer system to set the subsequent discrete value equal to the common value if the subsequent discrete value is between the common value and the common value minus K, wherein K is an incremental discrete value.

* * * * *